(12) United States Patent
Munoz-Bustamante et al.

(10) Patent No.: US 6,185,648 B1
(45) Date of Patent: Feb. 6, 2001

(54) PRINTER CIRCUIT BOARD FOR AN OPTOELECTRIC COMPUTER SYSTEM

(75) Inventors: Carlos Munoz-Bustamante, Durham; Daniel McConnell, Raleigh, both of NC (US)

(73) Assignee: International Business Machines, Armonk, NY (US)

( * ) Notice: Under 35 U.S.C. 154(b), the term of this patent shall be extended for 0 days.

(21) Appl. No.: 09/282,906

(22) Filed: Mar. 31, 1999

(51) Int. Cl.[7] .................................................. G06F 13/00
(52) U.S. Cl. ........................ 710/126; 710/129; 359/127
(58) Field of Search ................................... 710/126, 128, 710/129, 100, 101; 359/127, 126

(56) References Cited

U.S. PATENT DOCUMENTS

| | | |
|---|---|---|
| 4,720,634 | 1/1988 | D'Auria et al. . |
| 4,732,446 * | 3/1988 | Gipson et al. ........................ 385/24 |
| 4,809,363 * | 2/1989 | Thinschmidt et al. ............... 455/612 |
| 4,838,630 | 6/1989 | Jannson et al. . |
| 5,093,879 | 3/1992 | Bregman et al. . |
| 5,093,890 | 3/1992 | Bregman et al. . |
| 5,096,279 | 3/1992 | Hornbeck et al. . |
| 5,283,447 * | 2/1994 | Olbright et al. ........................ 257/85 |
| 5,404,373 * | 4/1995 | Cheng ..................................... 372/50 |
| 5,422,901 | 6/1995 | Lebby et al. . |
| 5,552,924 | 9/1996 | Tregilgas . |
| 5,572,540 | 11/1996 | Cheng . |
| 5,629,699 * | 5/1997 | Chazelas et al. .................... 341/137 |
| 5,673,284 | 9/1997 | Congdon et al. . |
| 5,708,280 * | 1/1998 | Lebby et al. ............................ 257/88 |
| 5,719,981 * | 2/1998 | Katoh et al. ......................... 385/129 |
| 5,789,733 | 8/1998 | Jackimowicz et al. . |

* cited by examiner

*Primary Examiner*—Ario Etienne
(74) *Attorney, Agent, or Firm*—George E. Grosser; Andrew Dillon

(57) ABSTRACT

An improved architecture for an optoelectric computer system is disclosed. The computer system includes an optical bus and an electrical bus. With this computer system, electrical devices are connected to the electrical bus and optoelectric devices are connected to the optical bus. Furthermore, a few optoelectric devices are utilized to provide communications between the optical bus and the electrical bus.

5 Claims, 5 Drawing Sheets

PRINTER CIRCUIT BOARD FOR AN OPTOELECTRIC COMPUTER SYSTEM

BACKGROUND OF THE INVENTION

1. Technical Field

The present invention relates to data processing system in general, and in particular to an optoelectric data processing system. Still more particularly, the present invention relates to an improved architecture for an optoelectric computer system.

2. Description of the Prior Art

Within most computer systems, a bus (or a group of buses) is typically the primary vehicle by which communication among electronic components takes place. Although there are different types of buses, in its most basic form, each bus is simply a series of electrical wires interconnecting various electronic components within a computer system. The electrical transmission characteristics of a bus are defined by the material properties of the bus, the physical geometry of the components, the clock speed of the signals, and the noise within the bus. Thus, both the limitations in materials and the limitations in electronic components contribute to the electrical transmission characteristics of a bus.

As computer systems become more complex, there is a continuing need to drive signals within a bus at a faster clock rate while at the same time minimizing power, noise, and electromagnetic interference. Recent personal computer systems strive to enhance their performances by increasing clock speeds of processor(s) and a so-called "front side bus" that interconnects the processor(s) with a first level of components outside the processor(s) such as secondary or tertiary cache memories. While the internal speed of the processor(s) may have increased, the bottleneck remains to be at I/O junctions in which a system bus is involved, such as a memory access. The present disclosure provides an improved architecture for a computer system in order to enhance data throughput while retaining the legacy bus structures for other components within the computer system.

SUMMARY OF THE INVENTION

In accordance with a preferred embodiment of the present invention, a computer system includes an optical bus and an electrical bus. With this computer system, electrical devices are connected to the electrical bus and optoelectric devices are connected to the optical bus. Furthermore, a few optoelectric devices are utilized to provide communications between the optical bus and the electrical bus.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
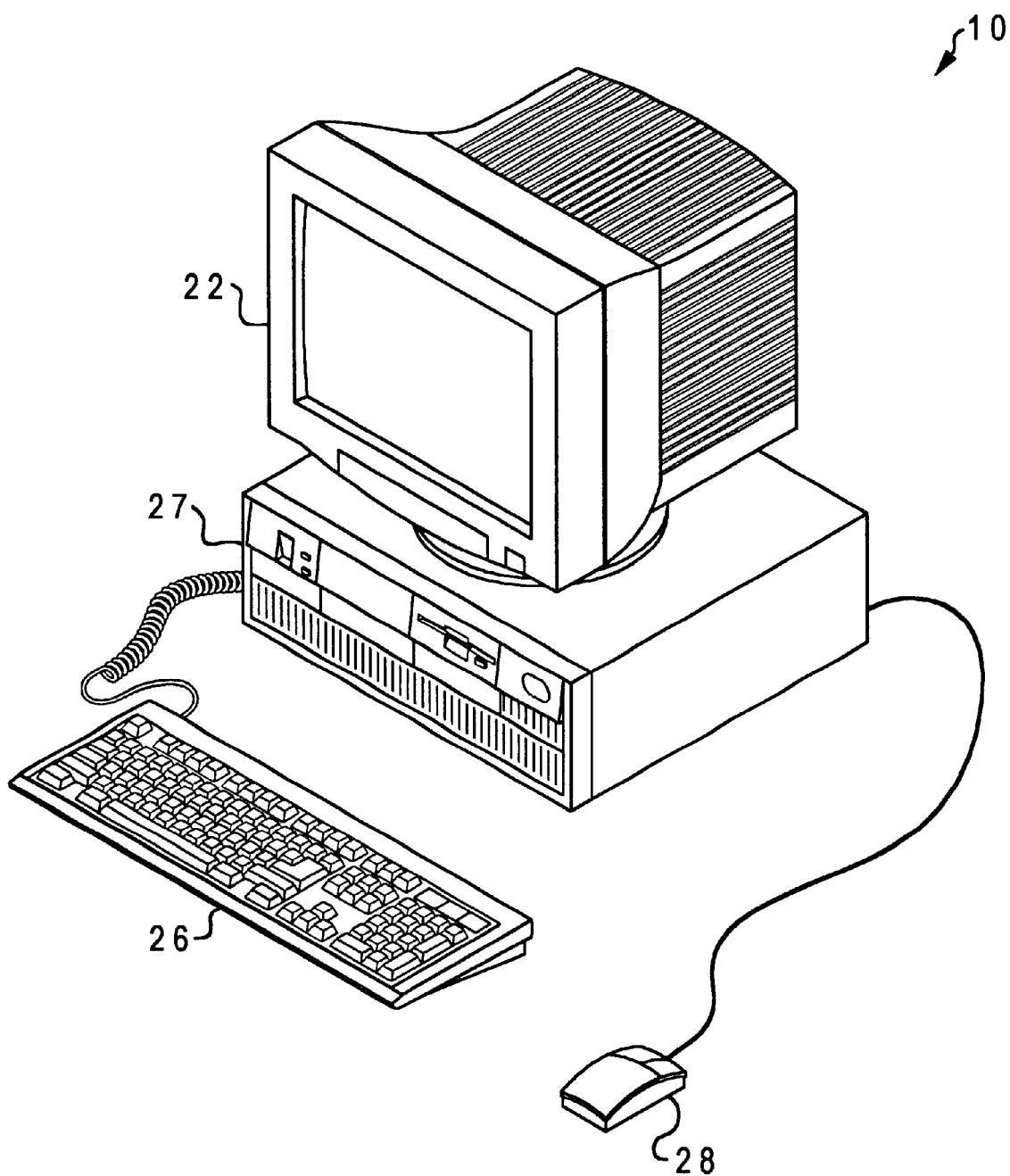
FIG. 1 is a pictorial view of an optoelectric computer system to which a preferred embodiment of the present invention is applicable.
Figure 2:
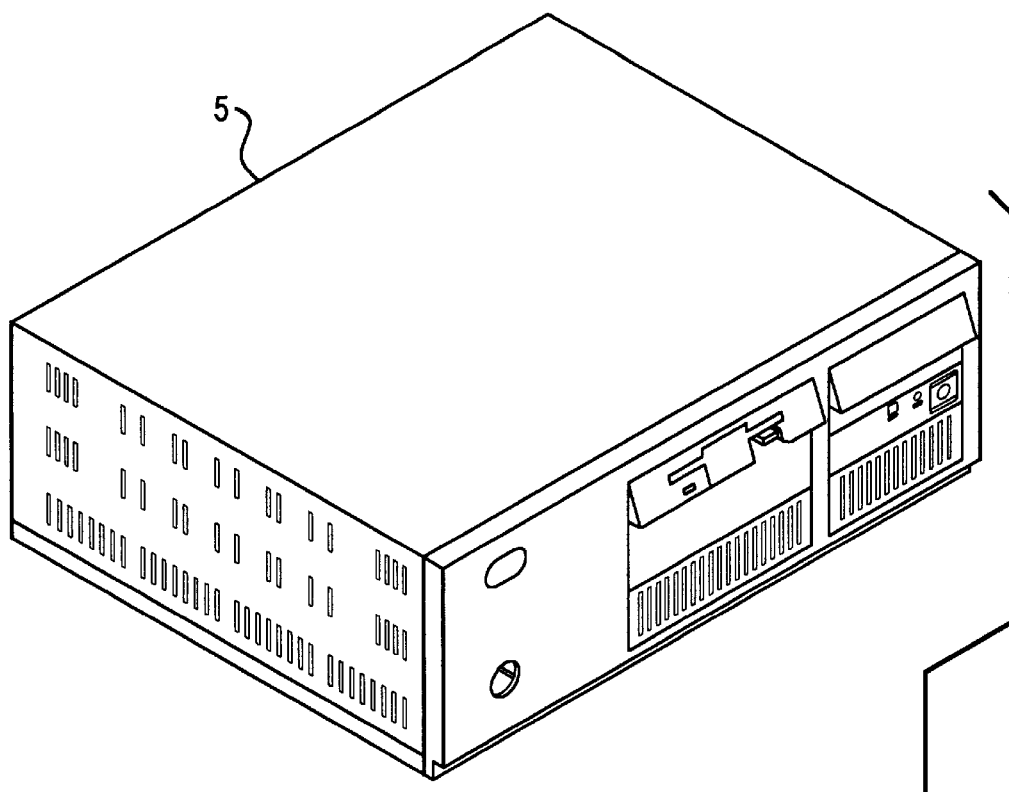
FIG. 2 is an exploded perspective view of various elements within the optoelectric computer system from FIG. 1.
Figure 2:
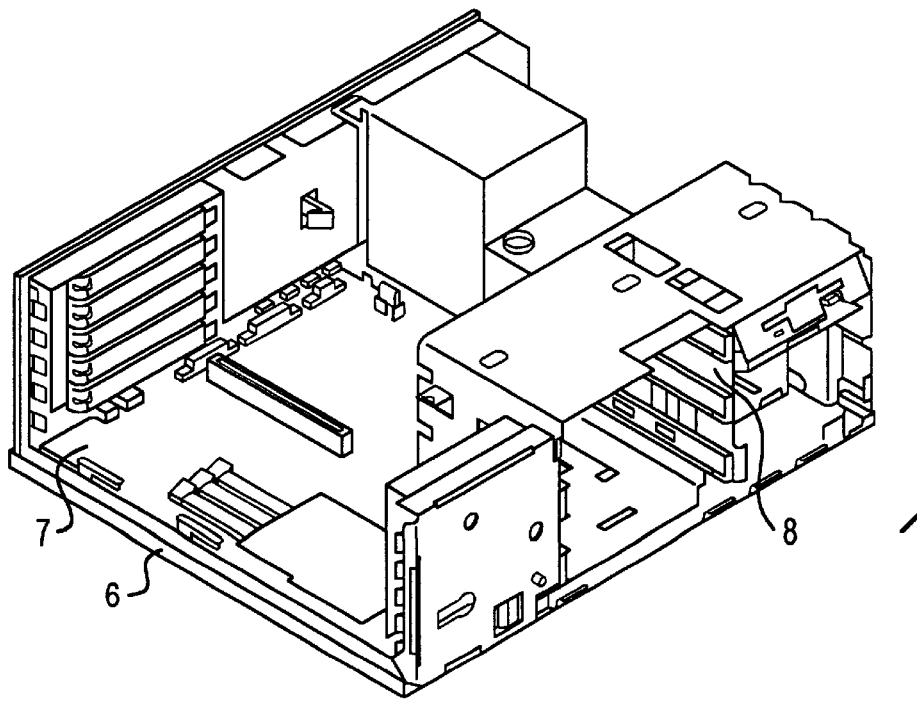

Referring now to the drawings and in particular to FIG. 1, there is depicted a block diagram of an optoelectric computer system to which a preferred embodiment of the present invention is applicable. An optoelectric computer system 10 includes a computer unit 27, a monitor 22, a keyboard 26, and a mouse 28. As shown in FIG. 2, computer unit 27 has a cover 5 that cooperates with a chassis 6 in defining an enclosed, shielded volume for receiving electrically powered data processing components. Some of the data processing components are mounted on a printed circuit board (or motherboard) 7 that is secured within chassis 6. Chassis 6 has a base and a rear panel and defines at least one open bay for receiving a data storage device such as a magnetic disk drive, an optical disk drive, or the like. As shown, an upper bay 8 is adapted to receive a floppy disk drive (not shown).

Figure 3:
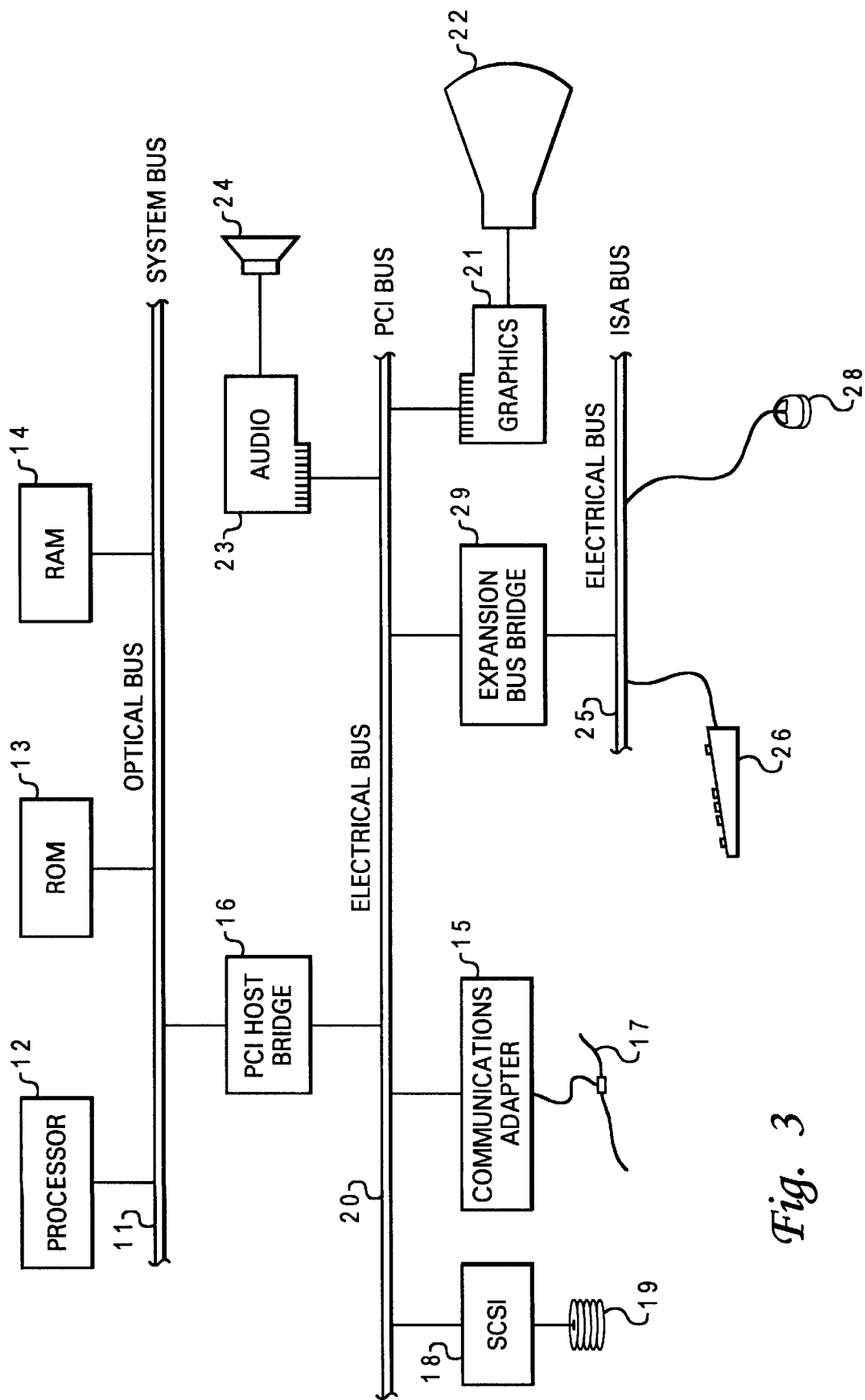
FIG. 3 is a block diagram of various elements of the optoelectric computer system from FIG. 1.

Referring now to FIG. 3, there is illustrated a block diagram of various components within optoelectric computer system 10, including components mounted on printed circuit board 7 and the connection of printed circuit board 7 to the I/O slots. As shown, a processor 12, a read-only memory (ROM) 13, and a Random Access Memory (RAM) 14 are connected to a system bus 11. Processor 12, ROM 13, and RAM 14 are also coupled to a peripheral component interconnect (PCI) bus 20 of optoelectric computer system 10 through a PCI host bridge 16. PCI host bridge 16 provides a low latency path through which processor 12 may directly access PCI devices mapped anywhere within bus memory and/or I/O address spaces. PCI host bridge 16 also provides a high bandwidth path allowing PCI devices to directly access RAM 14.

Also attached to PCI bus 20 is a communications adapter 15 and a small computer system interface (SCSI) 18. Communications adapter 17 connects optoelectric computer system 10 to a local-area network (LAN) 17. SCSI 18 is utilized to control a high-speed SCSI disk drive 19. Expansion bus bridge 29, such as a PCI-to-ISA (industry standard architecture) bus bridge, may be utilized for coupling an ISA bus 25 to PCI bus 20. As shown, keyboard 26 and mouse 28 are attached to ISA bus 25 for performing certain basic I/O functions. In addition, an audio adapter 23 and a graphics adapter 21 may be attached to PCI bus 20. Graphics adapter 21 controls visual output through monitor 22 and audio adapter 23 controls audio output through a speaker 24.

Figure 4:
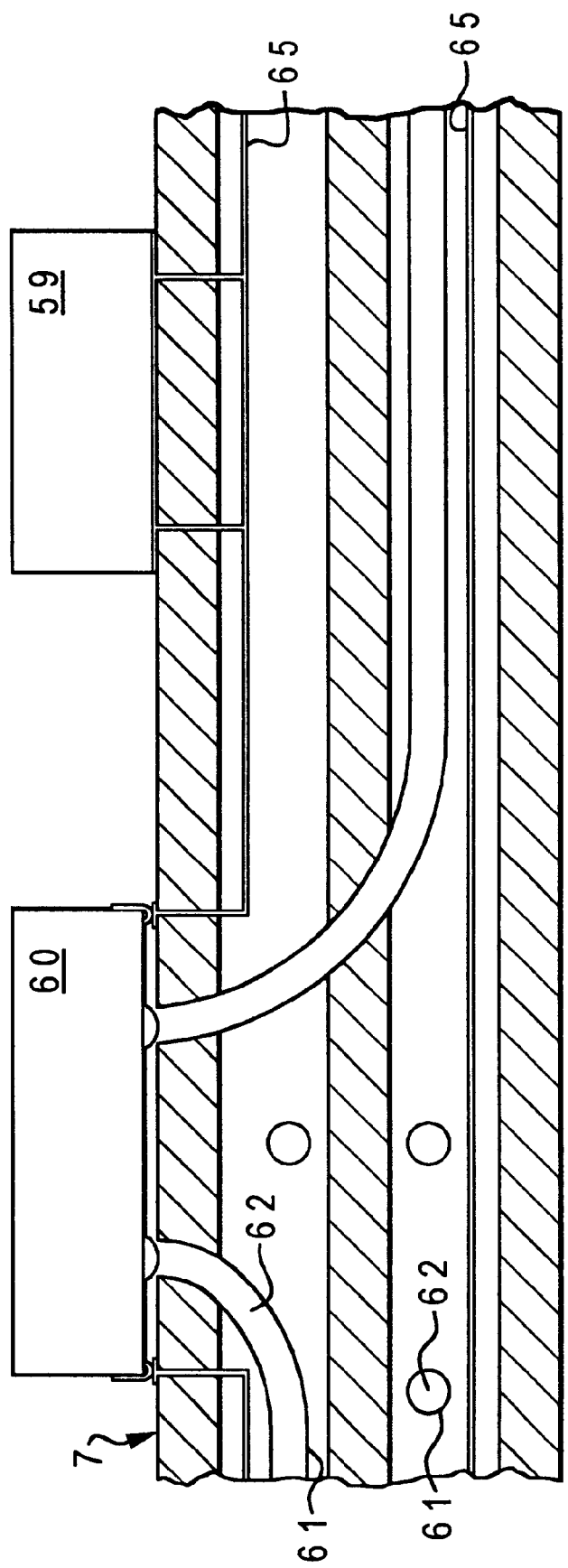
FIG. 4 is a section view of the printed circuit board from FIG. 2, having both optical buses and electrical buses, in accordance with a preferred embodiment of the present invention.

As a preferred embodiment of the present invention, system bus 11 is an optical bus, and PCI bus 20 and ISA bus 25 are both electrical buses. With reference now to FIG. 4, there is illustrated a section view of printed circuit board 7 having both optical buses and electrical buses, in accordance with a preferred embodiment of the present invention. As shown, printed circuit board 7 is a three layer laminated board, though more layers can be added. Electrical buses 65 are embedded within printed circuit board 7 for the transmission of electrical signals. Optical buses 61 comprised of optical fibers are embedded within printed circuit board 7 to form optical pathways 62 for transmitting optical signals.

For the purpose of illustration, FIG. 4 depicts two types of devices that can be found in the computer system of FIG. 3, namely, an electrical device 59 and an optoelectric device 60. Electrical device 59 has only electrical pin connections that are intended for connecting to an electrical bus such as PCI bus 20 or ISA bus 25 in FIG. 3. An example of electrical device 59 would be expansion bus bridge 29 in FIG. 3. Optoelectric device 60, having optical lens on the bottom of its package, connects to optical buses 61 such as system bus 11 in FIG. 3. In addition, optoelectric device 60 also has electrical pin connections that are connected to an electrical bus such as PCI bus 20 in FIG. 3. An example of optoelectric device 60 would be PCI host bridge 16 in FIG. 3.

Electrical device 59 or an electrical peripheral component, such as graphics adapter 21 and keyboard 26, can be electrically connected to PCI bus 20 and ISA bus 25, respectively, as is well-known to those skilled in the art. In order to optically connect to system bus 11, optoelectric device 60, such as PCI host bridge 16 and processor 12, preferable includes a vertical cavity surface emitting laser (VCSEL) to serve as a transducer for optoelectrical exchange between the device and system bus 11. Optical signals entering optoelectric device 60 are received by the VCSEL where the optical signals are converted into electrical signals. The electrical signals are conducted by electrical wire connections within optoelectric device 60. Similarly, electrical signals is also conducted by circuitry to the same or another VCSEL where the electrical signals are converted into optical signals.

Figure 5:
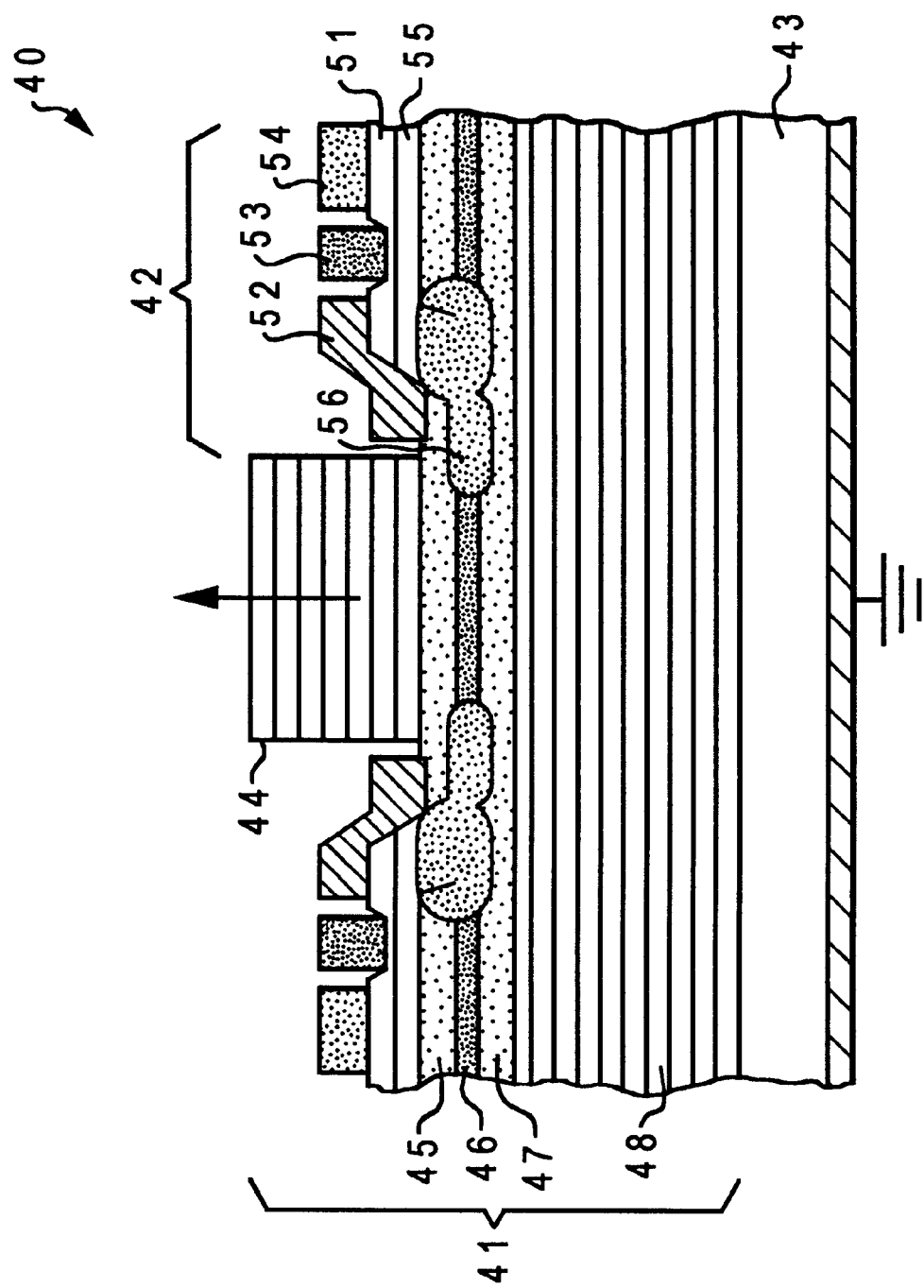
FIG. 5 is an illustration of a device having a VCSEL to serve as a transducer for optoelectrical exchange, in accordance with a preferred embodiment of the present invention.

Referring now to FIG. 5, there is illustrated a diagram of an optoelectric device having a VCSEL to serve as a transducer for optoelectrical exchange, in accordance with a preferred embodiment of the present invention. As shown, an optoelectric device 40 generally includes a VCSEL 41, a field effect transistor (FET) 42, and a substrate 43. Only one FET is shown within optoelectric device 40 for the simplicity of illustration and multiple FETs can be added depending on the demand. VCSEL 41 comprises a partially transmissive mirror 44, a p-type spacer 45, a quantum well 46, an n-type spacer 47, and an n-type mirror 48. FET 42 comprises an n-type channel 51, a source 52, a gate 53, and a drain 54, formed on top of an insulating layer 55. A guard ring 56 isolates source 52 so that current flow must be through the narrow region of guard ring 56.

Substrate 43 is preferably made of n-type Gallium Arsenide (GaAs) and FET 42 is also a GaAs device. VCSEL 41 includes alternating layers of dope Aluminum Arsenide (AlAs) and Aluminum Gallium Arsenide (AlGaAs). Spacers 45 and 47 are made of Aluminum Gallium Indigo Phosphate (AlGaInP). Quantum well 46 is made of layers of GaInP separated by barrier layers of AlGaInP.

The layers of mirror 48, spacer 47, quantum well 46, and spacer 45 are deposited on substrate 43 in that order. To form FET 42, insulating layer 55 is formed on top of spacer 47 and FET channel 51 is formed on top of spacer 45. The layers of mirror 48 are then deposited. The shape of mirror 44 is then defined photolithographically and the deposited layers will subsequently be removed from those areas that are not part of mirror 44. Finally, metallization is deposited and source 52, gate 53, and drain 54 are formed.

When an electrical signal having a suitable voltage is applied between drain 54 and substrate 43 of circuit 40, circuit 40 will operate as an electrically switched laser responsive to voltage signals applied to gate 53. Application of an appropriate voltage to gate 53 will allow enough current to flow through VCSEL 41 to cause VCSEL 43 to emit a laser, that is, an optical signal, through mirror 44. The optical signal will then be transmitted by the fiber optic cables.

As has been described, the present invention provides an improved architecture for a computer system. The computer system of the present invention includes an optical system bus and other electrical buses such as a PCI bus and an ISA bus. The present invention further utilizes optoelectric devices such as an optoelectric PCI host bridge to optically link the optical system bus to the electrical buses such that the legacy bus structure of the computer system can be retained.

While the invention has been particularly shown and described with reference to a preferred embodiment, it will be understood by those skilled in the art that various changes in form and detail may be made therein without departing from the spirit and scope of the invention.

What is claimed is:

1. A printed circuit board utilized within an optoelectric computer system, comprising:

a single printed circuit board having at least one substantially planar surface;

at least one optical bus within said single printed circuit board;

at least one electrical bus within said single printed circuit board;

a plurality of electrical devices connected to said at least one electrical bus; and a plurality of optoelectric devices, wherein some of said plurality of optoelectric devices are only connected to said at least one optical bus and a remainder of said plurality of optoelectric devices are coupled between said at least one optical bus and said at least one electrical bus, wherein each of said remainder of said plurality of optoelectric devices includes a vertical cavity surface emitting laser capable of converting optical signals from said at least one optical bus to electrical signals for said at least one electrical bus and converting electrical signals from said at least one electrical bus to optical signals for said at least one optical bus.

2. The printed circuit board according to claim 1, wherein said optical bus is a system bus.

3. The printed circuit board according to claim 1, wherein said electrical bus is a peripheral component interconnect bus.

4. The printed circuit board according to claim 1, wherein said electrical bus is an industry standard architecture bus.

5. The printed circuit board according to claim 1, wherein one of said remaining plurality of optoelectric devices is a host bridge.

\* \* \* \* \*